United States Patent [19]

Park et al.

[11] Patent Number: 5,500,544
[45] Date of Patent: Mar. 19, 1996

[54] DYNAMIC RANDOM ACCESS MEMORY CELL AND METHOD FOR FABRICATING THE SAME

[75] Inventors: Chan K. Park; Yo H. Koh; Seong M. Hwang; Kwang M. Roh, all of Ichonkun, Rep. of Korea

[73] Assignee: Hyundai Electronics Industries Co., Ltd., Rep. of Korea

[21] Appl. No.: 228,021

[22] Filed: Apr. 15, 1994

[30] Foreign Application Priority Data

Apr. 16, 1993 [KR] Rep. of Korea .................... 1993-6462

[51] Int. Cl.$^6$ ........................ H01L 27/108; H01L 21/265
[52] U.S. Cl. .......................... 257/296; 257/305; 257/401; 257/751; 257/754; 257/908; 257/909; 437/48; 437/50; 437/186; 437/203; 437/233; 437/913
[58] Field of Search ...................... 257/296, 305, 257/908, 909, 401, 751, 754; 437/48, 50, 186, 203, 233, 913

[56] References Cited

U.S. PATENT DOCUMENTS 5,109,259  4/1992  Banerjee .................. 257/305
5,264,712  11/1993  Murata ..................... 257/305

*Primary Examiner*—Edward Wojciechowicz
*Attorney, Agent, or Firm*—Merchant, Gould, Smith, Edell, Welter & Schmidt

[57] ABSTRACT

The DRAM cell comprises a bit line having a topology higher than a plate electrode atop a dielectric film formed on a charge storage electrode, wherein the bit line is connected with a drain region and also with an oxide film which is formed at a predetermined portion of the plate electrode placed above the drain region, the oxide film playing a role in insulating said plate electrode from said bit line.

Serving as an insulator between the plate electrode and the bit line, the oxide film is formed by oxidizing the plate electrode adjacent to the bit line. By virtue of this oxide film, there can be secured allowance for the formation of highly integrated device.

A DRAM cell can be fabricated in fewer process steps according to the present invention. The DRAM cell is superior in reliability even if it is highly integrated since the area of the capacitor is largely secured without any short phenomenon of bit line.

4 Claims, 3 Drawing Sheets ized DRAM cell and method for fabricating the same.

DYNAMIC RANDOM ACCESS MEMORY CELL AND METHOD FOR FABRICATING THE SAME

BACKGROUND OF THE INVENTION

1. Field of the invention

The present invention relates to a dynamic random access memory cell (hereinafter, "DRAM cell") in which a bit line is formed above a charge storage electrode and a method for fabricating the same.

2. Description of the Prior Art

For better understanding of the background of the present invention, there will be described a conventional DRAM cell along with its problems.

Referring to FIG. 1, there is shown a conventional DRAM cell structure in which a bit line is formed above a charge storage electrode. As shown in FIG. 1, a bit line 8 is connected with a drain region 10' after coating an interlayer insulating film 7 on a capacitor of the DRAM cell comprising a plate electrode 6 formed on a dielectric film 5 atop a charge storage electrode 4 of a predetermined size which, in turn, is in contact with a source region 10 of an MOS transistor. The plate electrode 6 must be some distance apart from the bit line 8 because the connection of the capacitor with the bit line causes miss operations.

In this drawing, reference numeral 1 designates a field oxide film, numeral 2 a gate electrode, numeral 2' a gate oxide film, numeral 3 another interlayer insulating film, numeral 11 a P-well and numeral 12 a silicon substrate.

Such conventional DRAM cell structure has to sufficiently overlap with the plate electrode in order to secure sufficient capacitance of the capacitor. However, since some distance between the bit line contact and the plate electrode is indispensable to the fabrication of the DRAM cell so as not to form a short circuit in them, the charge storage electrodes 4 are remote from each other, so that the area of the capacitor cannot help being diminished. Therefore, the capacitance of the capacitor becomes small.

In order to compensate for the small capacitance, there has been made an attempt to make the dielectric of the capacitor thin, or there has been required a three dimensional charge storage electrode. However, methods for the fabrication of such three dimensional structure are very complicated, thereby deteriorating DRAM cell reliability.

SUMMARY OF THE INVENTION

Therefore, an object of the present invention is to overcome the above problems encountered in prior art and to provide a DRAM cell superior in reliability and capable of securing sufficient capacitance of a capacitor, and to provide a method for the fabrication of DRAM cell, capable of securing allowance, whereby a highly integrated semiconductor device can be constructed. Serving as an insulator between the plate electrode and the bit line, the oxide film is formed by oxidizing the plate electrode adjacent to the bit line. By virtue of this oxide film, there can be secured allowance for the formation of highly integrated device.

In accordance with the present invention, the above object can be accomplished by providing a DRAM cell comprising a bit line having a topology higher than a plate electrode atop a dielectric film formed on a charge storage electrode, wherein the bit line is connected with a drain region and also with an oxide film which is formed at a predetermined portion of the plate electrode placed above the drain region, the oxide film playing a role in insulating the plate electrode from the bit line.

In accordance with the present invention, there is also provided a method for fabricating a DRAM cell wherein a bit line has a topology higher than a capacitor of a semiconductor device and is connected with a drain region of a transistor, comprising the steps of: depositing a polysilicon film over a dielectric film formed on a charge storage electrode, to form a plate electrode; coating an interlayer insulating film on the resulting structure comprising the plate electrode and then, opening a predetermined portion of the interlayer insulating film, to form a contact hole exposing the drain region therethrough; oxidizing a portion of the plate electrode to form an oxide film, the plate electrode having been exposed in the course of the formation of the contact hole; removing an oxide film which has been formed on the drain region in the course of the oxidation of the plate electrode; and contacting the bit line with the contact hole.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE INVENTION

Figure 1:
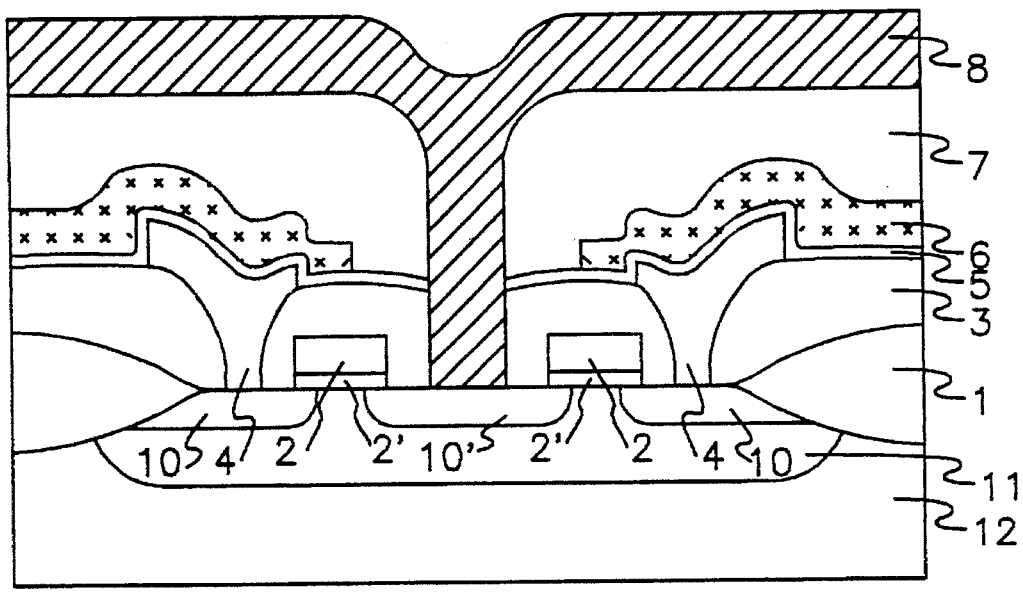
FIG. 1 is a schematic, cross sectional view showing a conventional DRAM cell.

Hereinafter, the preferred embodiments of the present invention will be in detail, described with reference to the accompanying drawings, wherein like reference numerals designate like parts, respectively.

Figure 2:
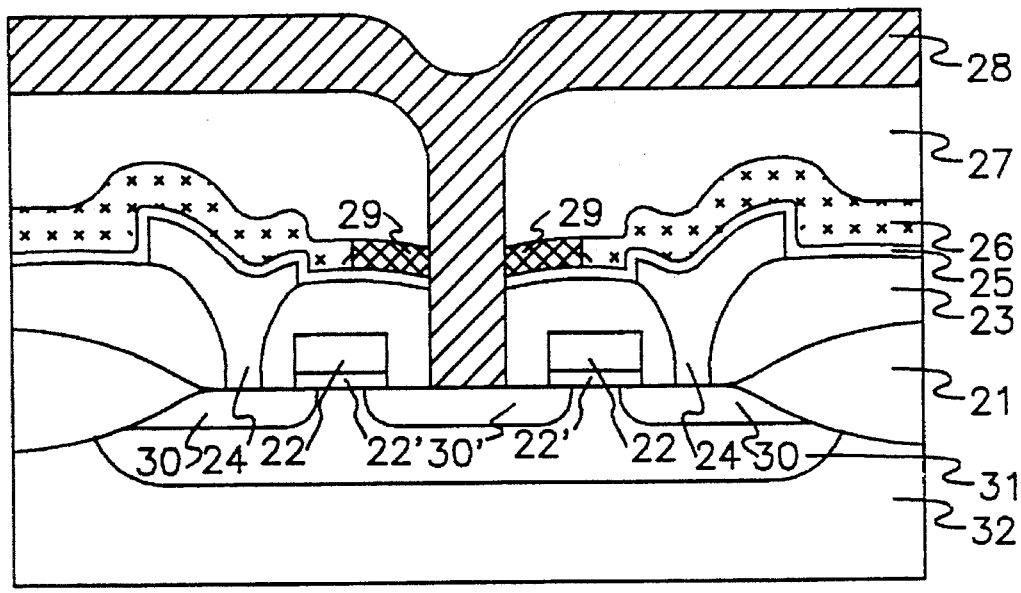
FIG. 2 is a schematic, cross sectional view showing a DRAM cell according to the present invention.

Referring initially to FIG. 2, there is illustrated a DRAM cell structure according to the present invention. In the DRAM cell, a bit line 28, as shown in this figure, is connected with a drain region 30' of an MOSFET from a topology higher than that of a dielectric film 25 atop a plate electrode 26 atop a dielectric film 25 deposited on a charge storage electrode 24, and is also connected with an oxide film 29 which is formed by oxidizing a portion of the plate electrode 26 which is placed above the drain region 30' and adjacent to the bit line.

Figure 3A:
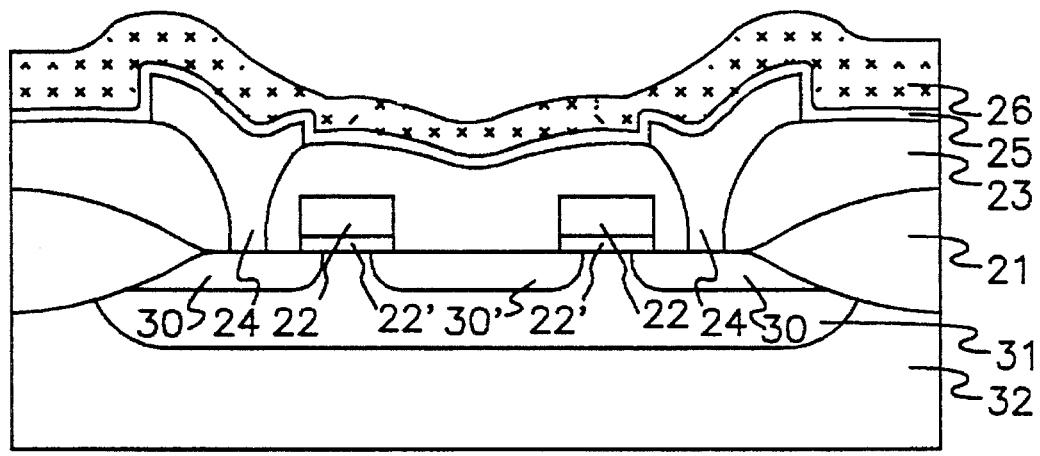
FIGS. 3A through 3C are schematic, cross sectional views showing a method for the fabrication of DRAM cell, according to the present invention
Figure 3B:
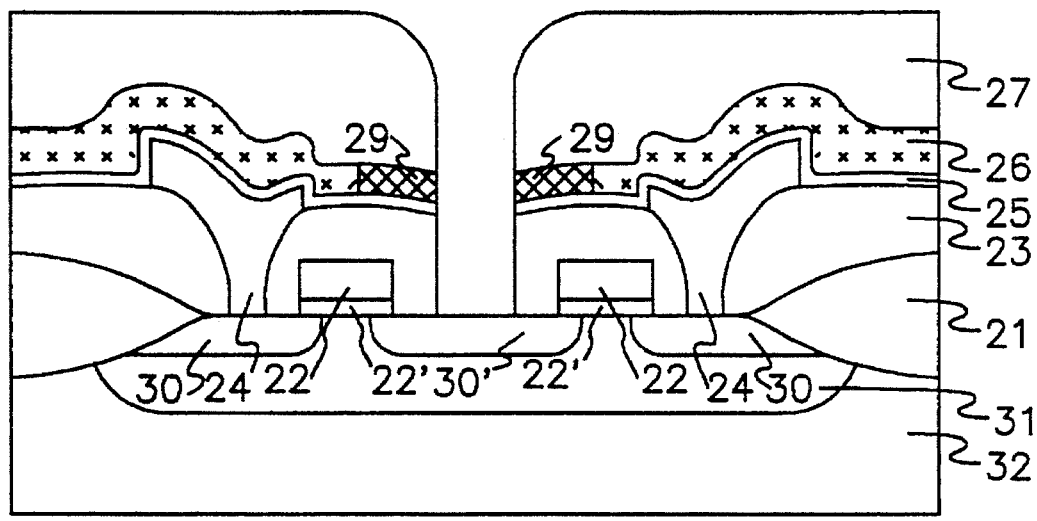
Figure 3C:
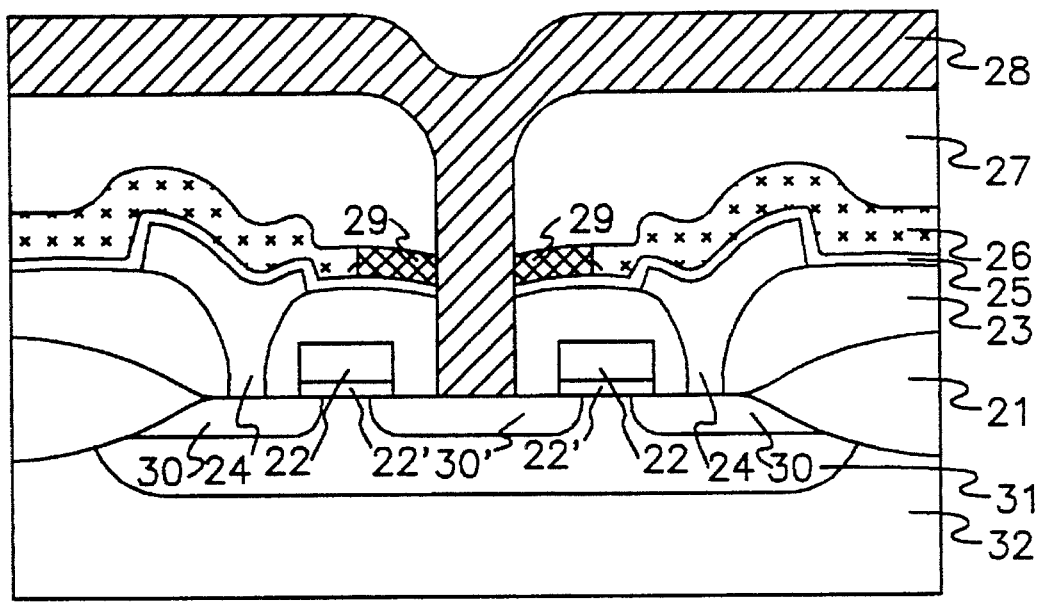

Referring now to FIGS. 3A through 3C, there is illustrated a method for fabricating the DRAM cell, according to the present invention.

First, after making a general MOSFET consisting of a silicon substrate 32 comprising a P-well 31, a field oxide film 21, a gate electrode 22, a gate oxide film 22', a source region 30 and a drain region 30', an interlayer insulating film 23 is deposited entirely over the resulting structure of the MOSFET and subjected to planarization, as shown in FIG. 3A. A contact hole is formed on the source region 30, and a polysilicon film is deposited and patterned, so as to form a charge storage electrode 24 in the contact hole. Over the resulting structure comprising the charge storage electrode 24, a dielectric film 25 and a plate electrode 26 of polysilicon are formed, in due order.

Subsequently, an interlayer insulating film 27 is formed and then subjected to planarization, as shown in FIG. 3B. Using a contact mask for bit line, an etch process is applied to the interlayer insulating film 27, the plate electrode 26, the dielectric film 25 and the interlayer insulating film 23, to form a bit line contact hole exposing a predetermined portion of the drain region 30' therethrough. Following this, a wet etch or a dry etch is carried out at 600° to 900° C. and under a pressure of not less than 1 atm, to form oxide films on the drain region 30' and the plate electrode 26 which both have somewhat low doping concentrations. The oxide film 29 formed on the plate electrode 26 is grown at least 2 times as thick as the oxide film on the drain region 30' because the doping concentration of the oxide film 29 is higher than that of the drain region 30'. After the formation of the oxide film 29, an anisotropic etch is carried out, which removes only the oxide film formed on the drain region 30' but leaves the oxide film 29 formed on the drain region 30'. Accordingly, the oxide film 29 plays a role in insulating the plate electrode 26 from a bit line which is to be formed at subsequent step.

Finally, a polysilicon is deposited, so as to form the bit line 28, as shown in FIG. 3C.

In the drawings, reference numerals 30 and 30' each designate $N^+$ regions.

As described hereinbefore, the method according to the present invention is capable of fabricating a DRAM cell in fewer process steps than the conventional method, and capable of forming a capacitor having larger area without a short phenomenon between the plate electrode and the bit line. Consequently, the DRAM cell according to the present invention is superior in reliability even if it is highly integrated.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A DRAM cell comprising: a bit line having a topology higher than a polysilicon plate electrode atop a dielectric film formed on a charge storage electrode, said cell including an insulating film separating a portion of said bit line and said plate electrode, said bit line being connected with a drain region and also with an oxide film, said oxide film being an oxidized extension of said plate electrode and being located above said drain region, said oxide film and said insulating film insulating said plate electrode from said bit line.

2. A method for fabricating a DRAM cell wherein a bit line has a topology higher than a capacitor of a semiconductor device and is connected with a drain region of a transistor, comprising the steps of:

depositing a polysilicon film over a dielectric film formed on a charge storage electrode, to form a plate electrode;

coating an interlayer insulating film on the resulting structure comprising said plate electrode and then, forming a contact hole being spaced apart from said charge storage electrode and exposing said drain region therethrough;

oxidizing a portion of said plate electrode to form a first oxide film, said plate electrode having been exposed in the course of the formation of said contact hole, said oxidizing step also forming a second oxide film on said drain region;

removing the second oxide film; and contacting said bit line with said drain region through said contact hole.

3. A method according to claim 2, wherein said first oxide film at a portion of said plate electrode is formed at temperatures ranging from approximately 600° to approximately 900° C.

4. A method according to claim 2, wherein said first oxide film at a portion of said plate electrode is formed under a pressure of not less than 1 atm.

* * * * *